(12) United States Patent
Mok

(10) Patent No.: US 11,424,179 B2
(45) Date of Patent: Aug. 23, 2022

(54) ULTRA-THIN COMPONENT CARRIER HAVING HIGH STIFFNESS AND METHOD OF MANUFACTURING THE SAME

(71) Applicant: AT&S (Chongqing) Company Limited, Chongqing (CN)

(72) Inventor: Jeesoo Mok, Chongqing (CN)

(73) Assignee: AT&S(Chongqing) Company Limited, Chongqing (CN)

( * ) Notice: Subject to any disclaimer, the term of this patent is extended or adjusted under 35 U.S.C. 154(b) by 9 days.

(21) Appl. No.: 16/793,062

(22) Filed: Feb. 18, 2020

(65) Prior Publication Data

US 2020/0273785 A1 Aug. 27, 2020

(30) Foreign Application Priority Data

Feb. 21, 2019 (CN) .......................... 201910130268.X

(51) Int. Cl.
*H05K 1/00* (2006.01)
*H05K 1/02* (2006.01)
(Continued)

(52) U.S. Cl.
CPC ...... *H01L 23/49822* (2013.01); *H01L 21/481* (2013.01); *H01L 21/4857* (2013.01);
(Continued)

(58) Field of Classification Search
CPC .. H05K 1/02; H05K 1/03; H05K 1/09; H05K 1/11; H05K 1/16; H05K 1/18; H05K 3/00;
(Continued)

(56) References Cited

U.S. PATENT DOCUMENTS 5,162,240 A * 11/1992 Saitou ................. H01L 21/4857
257/E23.173
9,368,450 B1 * 6/2016 Gu ...................... H01L 23/5385
(Continued)

FOREIGN PATENT DOCUMENTS

CN 1925148 3/2007

OTHER PUBLICATIONS

English translation of Notification of First Office Action in Application No. 201910130268.X; pp. 1-3; dated Aug. 4, 2020; The China National Intellectual Property Administration; No. 6, Xitucheng Lu, Jimenqiao Haidian District, Beijing City, 100088, China.
(Continued)

*Primary Examiner* — Xiaoliang Chen
(74) *Attorney, Agent, or Firm* — Robert A. Blaha; Smith Tempel Blaha LLC

(57) ABSTRACT

A method of manufacturing a component carrier includes forming a stack with electrically conductive layer structures and at least one electrically insulating layer structure; configuring the stack as a redistribution structure for transferring between a smaller pitch on one side of the stack towards a larger pitch on an opposing other side of the stack; arranging a first stiffening structure and a second stiffening structure in opposing surface regions of the stack. A component carrier and an electric device manufactured with the method exhibit improved stiffness and signal integrity.

10 Claims, 6 Drawing Sheets

(51) Int. Cl.
| | |
|---|---|
| H05K 1/03 | (2006.01) |
| H05K 1/05 | (2006.01) |
| H05K 1/09 | (2006.01) |
| H05K 1/11 | (2006.01) |
| H05K 1/16 | (2006.01) |
| H05K 1/18 | (2006.01) |
| H05K 3/00 | (2006.01) |
| H05K 3/02 | (2006.01) |
| H05K 3/06 | (2006.01) |
| H05K 3/10 | (2006.01) |
| H05K 3/30 | (2006.01) |
| H05K 3/32 | (2006.01) |
| H05K 3/36 | (2006.01) |
| H05K 3/38 | (2006.01) |
| H05K 3/40 | (2006.01) |
| H05K 3/42 | (2006.01) |
| H05K 3/44 | (2006.01) |
| H05K 3/46 | (2006.01) |
| H01L 23/498 | (2006.01) |
| H01L 25/00 | (2006.01) |
| H01L 21/56 | (2006.01) |
| H01L 21/48 | (2006.01) |

(52) U.S. Cl.
CPC ........ *H01L 21/56* (2013.01); *H01L 23/49838* (2013.01); *H01L 25/00* (2013.01); *H01L 23/49816* (2013.01)

(58) Field of Classification Search
CPC .. H05K 3/10; H05K 3/30; H05K 3/42; H05K 1/00; H05K 1/05; H05K 1/165; H05K 3/02; H05K 3/06; H05K 3/32; H05K 3/36; H05K 3/38; H05K 3/40; H05K 3/44; H05K 3/46; H05K 3/52; H01L 21/44; H01L 21/50; H01L 21/60; H01L 23/00; H01L 23/02; H01L 23/48; H01L 23/52; H01L 23/482; H01L 23/498; H01L 23/538

USPC ........ 361/762, 767, 783, 688, 792; 174/251, 174/255, 257, 258, 260, 266, 250, 254, 174/262, 264; 257/532, 675, 678, 687, 257/734, 737, 773, 774; 438/108, 127, 438/597; 29/108, 127, 597, 745, 829, 29/830, 846, 852; 428/209, 212

See application file for complete search history.

(56) References Cited

U.S. PATENT DOCUMENTS

| | | | | |
|---|---|---|---|---|
| 9,875,958 B1* | 1/2018 | Buvid | .................. | H01L 21/486 |
| 10,181,449 B1* | 1/2019 | Chen | ........................ | H01L 24/24 |
| 2004/0145040 A1* | 7/2004 | Fukuda | .................. | H01L 24/97 257/687 |
| 2007/0075726 A1* | 4/2007 | Chan | .................... | H05K 3/4007 324/754.18 |
| 2007/0167972 A1* | 7/2007 | Euteneuer | ............. | A61M 25/09 606/192 |
| 2007/0178686 A1* | 8/2007 | Honda | .................. | H01L 21/563 438/597 |
| 2007/0256858 A1* | 11/2007 | Kariya | ................ | H01L 21/4857 174/260 |
| 2009/0121334 A1* | 5/2009 | Oi | ..................... | H01L 23/49816 257/678 |
| 2009/0242245 A1 | 10/2009 | Asano | | |
| 2010/0078786 A1* | 4/2010 | Maeda | .................... | H01L 23/16 257/678 |
| 2010/0208442 A1* | 8/2010 | Asano | .................. | H05K 1/0271 361/783 |
| 2011/0056614 A1 | 3/2011 | An et al. | | |
| 2011/0133342 A1* | 6/2011 | Arai | ...................... | B81C 1/0023 257/774 |
| 2011/0169133 A1* | 7/2011 | Arai | ....................... | H01L 28/40 257/532 |
| 2011/0175213 A1* | 7/2011 | Mori | ...................... | H01L 23/13 257/675 |
| 2011/0180930 A1* | 7/2011 | Arai | ..................... | H05K 3/4688 257/773 |
| 2012/0018194 A1* | 1/2012 | Maeda | ................. | H05K 3/0035 174/251 |
| 2012/0161311 A1* | 6/2012 | Miyasaka | ......... | H01L 23/49894 257/734 |
| 2012/0175153 A1* | 7/2012 | Kaneko | ................... | H05K 1/113 174/251 |
| 2012/0267751 A1* | 10/2012 | Haba | ..................... | H05K 3/4046 257/499 |
| 2013/0008706 A1* | 1/2013 | Tseng | .................. | H01L 21/4857 174/266 |
| 2013/0140692 A1* | 6/2013 | Kaneko | ................... | H05K 1/113 257/737 |
| 2013/0215586 A1* | 8/2013 | Furusawa | ......... | H01L 23/49827 361/767 |
| 2013/0256012 A1* | 10/2013 | Kodani | ................... | H01L 25/16 174/257 |
| 2014/0097009 A1* | 4/2014 | Kaneko | ................ | H05K 3/4682 174/258 |
| 2014/0102766 A1 | 4/2014 | Kim et al. | | |
| 2014/0138826 A1* | 5/2014 | Kumar | ............... | H01L 23/49827 257/738 |
| 2014/0268612 A1 | 9/2014 | Zhang et al. | | |
| 2015/0084206 A1* | 3/2015 | Lin | ..................... | H01L 23/5389 257/774 |
| 2015/0096791 A1* | 4/2015 | Katsube | ............... | H05K 3/4629 174/255 |
| 2015/0181703 A1 | 6/2015 | Tanaka et al. | | |
| 2015/0305155 A1 | 10/2015 | Shiroshita et al. | | |
| 2016/0099197 A1* | 4/2016 | Uematsu | ............. | H01L 23/5385 257/759 |
| 2016/0268188 A1* | 9/2016 | Kariya | ................ | H01L 23/3121 |
| 2017/0011993 A1* | 1/2017 | Zhao | .................. | H01L 23/49811 |
| 2019/0162778 A1* | 5/2019 | Kanematsu | ........ | G01R 31/2884 |
| 2020/0219861 A1* | 7/2020 | Kamgaing | ........ | H01L 23/49827 |

OTHER PUBLICATIONS

Notification of First Office Action in Application No. 201910130268. X; pp. 1-8; dated Aug. 4, 2020; The China National Intellectual Property Administration; No. 6, Xitucheng Lu, Jimenqiao Haidian District, Beijing City, 100088, China.

Second Office Action in Application No. 201910130268.X; pp. 1-8; dated Mar. 2, 2022; The China National Intellectual Property Administration; No. 6, Xitucheng Lu, Jimenqiao Haidian District, Beijing City; 100088; China.

English Translation of Cover pages of Second Office Action in Application No. 201910130268.X; pp. 1-3; dated Mar. 2, 2022; The China National Intellectual Property Administration; No. 6, Xitucheng Lu, Jimenqiao Haidian District, Beijing City; 100088; China.

\* cited by examiner

ULTRA-THIN COMPONENT CARRIER HAVING HIGH STIFFNESS AND METHOD OF MANUFACTURING THE SAME

CROSS-REFERENCE TO RELATED APPLICATION

This application claims the benefit of the filing date of the Chinese patent application no. 201910130268.X filed on Feb. 21, 2019, which is incorporated herein by reference in its entirety.

TECHNICAL FIELD

Embodiments of the invention relate to a method of manufacturing a component carrier, a component carrier and an electric device.

Technological Background

Recent package substrates need a high signal transmission speed with the acceleration of miniaturization, and as I/O counts are increased. Thus, a coreless substrate is needed as a next generation platform of a flip-chip bonding type substrate according to customer demands. A coreless substrate can be manufactured thinner than a core type package substrate, and it reduces a path of signal transmission as well as implements a fine circuit on all layers. But a core with a thicker PTH (plated through-hole) causes noise in a signal transmission in a high frequency band. Conventional package substrates typically include at least one core layer impregnated in a dielectric material to provide mechanical rigidity for the substrate. In the case of a coreless substrate, since there is no core in the substrate, a warpage problem might occur during an assembly process compared to conventional package substrates with core layers. Warpage particularly occurs in the thin coreless substrate layers with asymmetric layers (i.e. 5 layers, 7 layers).

SUMMARY

There may be a need to provide an ultra-thin component carrier having a high stiffness, a method of manufacturing the same and an electric device comprising an ultra-thin component carrier. At the same time, thinner build-up layers with fine circuits shall be provided in the component carrier for signal integrity.

This need is achieved by a method of manufacturing a component carrier, a component carrier and an electric device according to the independent claims.

According to an exemplary embodiment of the invention, a method of manufacturing a component carrier is provided. The method comprises: forming a stack comprising electrically conductive layer structures and at least one electrically insulating layer structure; configuring the stack as a redistribution structure for transferring between a smaller pitch on one side of the stack towards a larger pitch on an opposing other side of the stack; and arranging a first stiffening structure and a second stiffening structure in opposing surface regions of the stack.

According to another exemplary embodiment of the invention, a component carrier is provided. The component carrier comprises: a stack having electrically conductive layer structures and at least one electrically insulating layer structure, wherein the stack is configured as a redistribution structure for transferring between a smaller pitch on one side of the stack towards a larger pitch on an opposing other side of the stack; and a first stiffening structure and a second stiffening structure being arranged in opposing surface regions of the stack.

According to example embodiments, a thinner coreless substrate with a high stiffness is achieved. The warpage problem is overcome for thin coreless substrates by a high modulus material property on the outer layer, i.e. the first and second stiffening structures. Moreover, the signal integrity is advanced by shorter paths in the electrically conductive layer structures and the electrically insulating layer structures which are present in the middle of the component carrier.

Overview of Embodiments

According to example embodiments, a high modulus material is applied on the outer layers of the stack for a better stiffness. A symmetric structure is achieved which comprises the thicker and rigid top layer, the thinner coreless layer in the middle and the thicker and rigid bottom layer.

Further, the component carrier realizes a so-called redistribution layer (RDL), where a first connecting structure having a first pitch is redistributed to a second connecting structure having a second pitch. Thereby, the component carrier may serve as an adapter between two connection partners.

In the following, further exemplary embodiments of the component carrier, the method of manufacturing a component carrier and the electronic device will be explained.

In an embodiment of the method, the electrically conductive layer structure extends at least through one of the first and second stiffening structures.

In an embodiment of the method, the method further comprises a step of embedding a component in at least one of the stiffening structures.

In an embodiment of the method, the electrically conductive layer structure extends through the stiffening structure in which the component is embedded.

In an embodiment of the method, a further component is surface mounted on the stiffening structure in which the component is embedded.

In an embodiment of the method, a stiffness of at least one of the stiffening structures is in a range between 50 and 1500 N·mm², preferred between 100 and 600 N·mm².

In an embodiment of the method, at least one of the stiffening structures is a mold compound.

In an embodiment of the method, the stiffening structures form part of two electrically insulating layer structures.

In an embodiment of the component carrier, the electrically conductive layer structure extends at least through one of the first and second stiffening structures. For example, fine bumper pitches with Cu pillars are possible.

In an embodiment of the component carrier, a component is embedded in at least one of the stiffening structures.

In an embodiment of the component carrier, the electrically conductive layer structure extends through the stiffening structure in which the component is embedded.

In an embodiment of the component carrier, a further component is surface mounted on the stiffening structure in which the component is embedded.

In an embodiment of the component carrier, a stiffness of at least one of the stiffening structures is in a range between 100 and 600 N·mm², preferred between 250 and 400 N·mm².

In an embodiment of the component carrier, at least one of the stiffening structures is a mold compound.

In an embodiment of the component carrier, the stiffening structures form part of two electrically insulating layer structures.

In an embodiment of the component carrier, the component carrier further comprises a component, in particular an electronic component, mounted on and/or embedded in the at least one electrically insulating layer structure and/or the at least one electrically conductive layer structure.

In an embodiment of the component carrier, the component is selected from a group consisting of an electronic component, an electrically non-conductive and/or electrically conductive inlay, a heat transfer unit, a light guiding element, an energy harvesting unit, an active electronic component, a passive electronic component, an electronic chip, a storage device, a filter, an integrated circuit, a signal processing component, a power management component, an optoelectronic interface element, a voltage converter, a cryptographic component, a transmitter and/or receiver, an electromechanical transducer, an actuator, a microelectromechanical system, a microprocessor, a capacitor, a resistor, an inductance, an accumulator, a switch, a camera, an antenna, a magnetic element, a further component carrier and a logic chip.

In an embodiment of the component carrier, the at least one electrically conductive layer structure comprises at least one of a group consisting of copper, aluminum, nickel, silver, gold, palladium, and tungsten, any of the mentioned materials being optionally coated with supra-conductive material such as graphene.

In an embodiment of the component carrier, the at least one electrically insulating layer structure comprises at least one of a group consisting of resin, in particular reinforced or non-reinforced resin, for instance epoxy resin or Bismaleimide-Triazine resin, FR-4, FR-5, cyanate ester, polyphenylene derivate, glass, prepreg material, polyimide, polyamide, liquid crystal polymer, epoxy-based Build-Up Film, polytetrafluoroethylene, a ceramic, and a metal oxide.

In an embodiment of the component carrier, the component carrier is shaped as a plate.

In an embodiment of the component carrier, the component carrier is configured as one of a group consisting of a printed circuit board, and a substrate.

In an embodiment of the component carrier, the component carrier is configured as a laminate-type component carrier.

In the context of the present application, the term "component carrier" may particularly denote any support structure which is capable of accommodating one or more components thereon and/or therein for providing mechanical support and/or electrical connectivity. In other words, a component carrier may be configured as a mechanical and/or electronic carrier for components. In particular, a component carrier may be one of a printed circuit board, an organic interposer, and an IC (integrated circuit) substrate. A component carrier may also be a hybrid board combining different ones of the above-mentioned types of component carriers.

In an embodiment, the component carrier comprises a stack of at least one electrically insulating layer structure and at least one electrically conductive layer structure. For example, the component carrier may be a laminate of the mentioned electrically insulating layer structure(s) and electrically conductive layer structure(s), in particular formed by applying mechanical pressure and/or thermal energy. The mentioned stack may provide a plate-shaped component carrier capable of providing a large mounting surface for further components and being nevertheless very thin and compact. The term "layer structure" may particularly denote a continuous layer, a patterned layer or a plurality of non-consecutive islands within a common plane.

In an embodiment, the component carrier is shaped as a plate. This contributes to the compact design, wherein the component carrier nevertheless provides a large basis for mounting components thereon. Furthermore, in particular a naked die as an example of an embedded electronic component, can be conveniently embedded, thanks to its small thickness, into a thin plate such as a printed circuit board.

In an embodiment, the component carrier is configured as one of a group consisting of a printed circuit board, a substrate (in particular an IC substrate), and an interposer.

In the context of the present application, the term "printed circuit board" (PCB) may particularly denote a plate-shaped component carrier which is formed by laminating several electrically conductive layer structures with several electrically insulating layer structures, for instance by applying pressure and/or by the supply of thermal energy. As preferred materials for PCB technology, the electrically conductive layer structures are made of copper, whereas the electrically insulating layer structures may comprise resin and/or glass fibers, so-called prepreg or FR4 material. The various electrically conductive layer structures may be connected to one another in a desired way by forming through-holes through the laminate, for instance by laser drilling or mechanical drilling, and by filling them with electrically conductive material (in particular copper), thereby forming vias as through-hole connections. Apart from one or more components which may be embedded in a printed circuit board, a printed circuit board is usually configured for accommodating one or more components on one or both opposing surfaces of the plate-shaped printed circuit board. They may be connected to the respective main surface by soldering. A dielectric part of a PCB may be composed of resin with reinforcing fibers (such as glass fibers).

In the context of the present application, the term "substrate" may particularly denote a small component carrier having substantially the same size as a component (in particular an electronic component) to be mounted thereon. More specifically, a substrate can be understood as a carrier for electrical connections or electrical networks as well as component carrier comparable to a printed circuit board (PCB), however with a considerably higher density of laterally and/or vertically arranged connections. Lateral connections are for example conductive paths, whereas vertical connections may be for example drill holes. These lateral and/or vertical connections are arranged within the substrate and can be used to provide electrical and/or mechanical connections of housed components or unhoused components (such as bare dies), particularly of IC chips, with a printed circuit board or intermediate printed circuit board. Thus, the term "substrate" also includes "IC substrates". A dielectric part of a substrate may be composed of resin with reinforcing particles (such as reinforcing spheres, in particular glass spheres).

The substrate or interposer may comprise or consist of at least a layer of glass, silicon (Si) or a photo-imageable or dry-etchable organic material like epoxy-based build-up films or polymer compounds like polyimide, polybenzoxazole, or benzocyclobutene.

In an embodiment, the at least one electrically insulating layer structure comprises at least one of a group consisting of resin (such as reinforced or non-reinforced resins, for instance epoxy resin or Bismaleimide-Triazine resin), cyanate ester, polyphenylene derivate, glass (in particular glass fibers, multi-layer glass, glass-like materials), prepreg material (such as FR-4 or FR-5), polyimide, polyamide, liquid crystal polymer (LCP), epoxy-based Build-Up Film, polytetrafluoroethylene (Teflon®), a ceramic, and a metal oxide. Teflon® is a registered mark of The Chemours Company FC, LLC of Wilmington, Del., U.S.A. Reinforcing materials such as webs, fibers or spheres, for example made of glass (multilayer glass) may be used as well. Although prepreg particularly FR4 are usually preferred for rigid PCBs, other materials in particular epoxy-based build-up film for substrates may be used as well. For high frequency applications, high-frequency materials such as polytetrafluoroethylene, liquid crystal polymer and/or cyanate ester resins, low temperature cofired ceramics (LTCC) or other low, very low or ultra-low DK-materials may be implemented in the component carrier as electrically insulating layer structure.

In an embodiment, the at least one electrically conductive layer structure comprises at least one of a group consisting of copper, aluminum, nickel, silver, gold, palladium, and tungsten. Although copper is usually preferred, other materials or coated versions thereof are possible as well, in particular materials coated with supra-conductive material such as graphene.

The at least one component can be selected from a group consisting of an electrically non-conductive inlay, an electrically conductive inlay (such as a metal inlay, preferably comprising copper or aluminum), a heat transfer unit (for example a heat pipe), a light guiding element (for example an optical waveguide or a light conductor connection), an electronic component, or combinations thereof. For example, the component can be an active electronic component, a passive electronic component, an electronic chip, a storage device (for instance a DRAM or another data memory), a filter, an integrated circuit, a signal processing component, a power management component, an optoelectronic interface element, a light emitting diode, a photocoupler, a voltage converter (for example a DC/DC converter or an AC/DC converter), a cryptographic component, a transmitter and/or receiver, an electromechanical transducer, a sensor, an actuator, a microelectromechanical system (MEMS), a microprocessor, a capacitor, a resistor, an inductance, a battery, a switch, a camera, an antenna, a logic chip, and an energy harvesting unit. However, other components may be embedded in the component carrier. For example, a magnetic element can be used as a component. Such a magnetic element may be a permanent magnetic element (such as a ferromagnetic element, an antiferromagnetic element or a ferrimagnetic element, for instance a ferrite core) or may be a paramagnetic element. However, the component may also be a substrate, an interposer or a further component carrier, for example in a board-in-board configuration. The component may be surface mounted on the component carrier and/or may be embedded in an interior thereof. Moreover, also other components, in particular those which generate and emit electro-magnetic radiation and/or are sensitive with regard to electromagnetic radiation propagating from an environment, may be used as a component.

In an embodiment, the component carrier is a laminate-type component carrier. In such an embodiment, the component carrier is a compound of multiple layer structures which are stacked and connected together by applying a pressing force and/or heat.

The aspects defined above and further aspects of the invention are apparent from the examples of embodiment to be described hereinafter and are explained with reference to these examples of embodiment.

DETAILED DESCRIPTION OF ILLUSTRATED EMBODIMENTS

Figure 1:
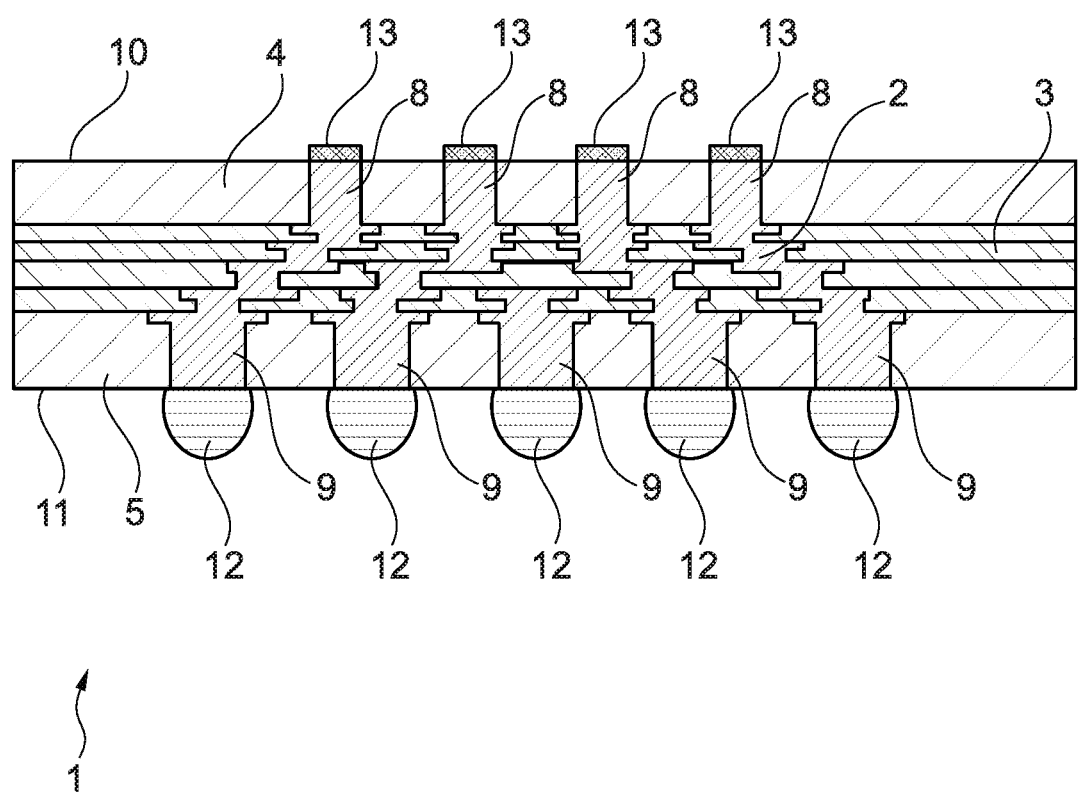
FIG. 1 illustrates a cross-sectional view of a component carrier according to an exemplary embodiment of the invention.

The illustrations in the drawings are schematically presented. In different drawings, similar or identical elements are provided with the same reference signs.

Before, referring to the drawings, some basic considerations will be summarized based on which exemplary embodiments of the invention have been developed.

According to an exemplary embodiment, a nano-coated structure may be used for component carrier technology, in particular as a dry-adhesive structure. An adhesive layer implementing such a surface configuration may also be denoted as gecko film. The adhesive effect of such a surface may be based on van der Waals forces. Descriptively speaking, a plurality of low dimensioned suction cups may be formed by such a concept. According to an exemplary embodiment of the invention, a reliable substrate and/or structured material is provided for embedding and/or surface mounting applications having specific adhesion properties due to a corresponding configuration of nano- and/or microstructures on this surface. Exemplary embodiments have the advantage that the mentioned adjustability of the surface adhesion properties may be obtained with low material consumption, low production costs, small contamination risk, and high process reliability.

In an embodiment, the mentioned materials may be used as support for component placement in embedding technologies. Compared to a traditional adhesive tape system that is depending on temperature and time, an exemplary embodiment uses the surface of a support (which may be rigid or flexible) or PCB elements (such as cores, prepregs, copper foils, etc.), that exhibits, thanks to the nano- and/or microstructures, van der Waals attraction forces, a gecko effect, a high grip, and that is dry and thus can be cleaned and reused. A sheet with nano- and/or microstructures can also be included in the final product. When used for an embedding concept, components may be placed on the dry surface and can be held in position by weak bonds (like van der Waals forces, gecko effect, high grip values) prior to the component lamination.

Such an architecture allows to obtain a dry interaction between the component and the holding substrate. No additional liquid adhesive is required. This has the advantages of a dry interaction, and a reduction of risk of contamination from the substrate.

FIG. 1 illustrates a cross-sectional view of a component carrier 1 according to an exemplary embodiment of the invention.

The component carrier 1 comprises a stack comprising electrically conductive layer structures 2 and electrically insulating layer structures 3.

The component carrier 1 further comprises a first stiffening structure 4 and a second stiffening structure 5 arranged in opposing surface regions of the stack. The first stiffening structure 4 is arranged at the one side 10 of the stack, while the second stiffening structure 5 is arranged at the opposing other side 11 of the stack.

The stiffening structures 4, 5 can be made of an electrically insulating material. The material of the stiffening structures 4, 5 can be selected from a mold compound, a laminate, a dielectric material, a prepreg material, etc. Then, the stiffening structure 4 forms part of the electrically insulating layer structures 3 at the one side 10 of the stack, while the stiffening structure 5 forms part of the electrically insulating layer structures 3 at the opposing other side 11 of the stack. In other words, the stiffening structures 4, 5 form part of two electrically insulating layer structures 3, that means the first stiffening structure 4 is part of the insulating layer structure 3 near the one side 10 of the stack, while the second stiffening structure 5 is part of the insulating layer structure 3 near the opposing other side 11 of the stack.

A stiffness of at least one of the stiffening structures 4, 5 can be in a range between 50 and 600 N·mm$^2$, preferred between 250 and 400 N·mm$^2$ measured according to DIN EN ISO 14125 (method A or B).

Although not shown in FIG. 1, a component can be embedded in at least one of the stiffening structures 4, 5.

A further component can be surface mounted on the stiffening structures 4, 5 in which the component is embedded.

The electrically conductive layer structure 2 extends through the stiffening structure 4, 5 in which the component can be embedded. In detail, at the one side 10 of the stack, vias 8 are provided which penetrate the first stiffening structure 4. The vias 8 are communicated with the electrically conductive layer structures 2. At the opposing other side 11 of the stack, vias 9 are provided which penetrate the second stiffening structure 5. The vias 9 are communicated with the electrically conductive layer structures 2.

The vias 8 at the one side 10 of the stack have a first pitch, while the vias 9 at the opposing other side 11 of the stack have a second pitch. The first pitch is smaller than the second pitch. Thus, the stack is configured as a redistribution structure for transferring between the smaller pitch on the one side 10 of the stack towards the larger pitch on the opposing other side 11 of the stack.

In general, the term "pitch" means a horizontal distance on a contact carrier surface between the vias 8, the vias 9, or pads, pins, soldering pads, solder balls, bonding pads or connecting pads by which the component carrier 1 is connectable to corresponding pads, pins, soldering pads, solder balls, bonding pads or connecting pads of another structure such as a chip or another component carrier.

The component carrier 1 of the present invention realizes a so-called redistribution layer (RDL), where a first connecting structure having a first pitch is redistributed to a second connecting structure having a second pitch.

On the vias 8, planar soldering or bonding pads 13 are applied. The soldering or bonding pads 13 are configured for a soldering or bonding connection between the component carrier 1 and a chip. On the vias 9, solder balls 12 are applied. The solder balls 12 are configured for a flip-chip connection between the component carrier 1 and another component carrier or PCB. The solder balls 12 are also called bumps.

Thus, the component carrier 1 has a high-density arrangement in the middle and a low-density arrangement near the first and second stiffening structures 4, 5. Although the component carrier 1 may be a so called ultra-thin component carrier 1, the same has a high stiffness at the outer sides due to the first and second stiffening structures 4, 5.

Figure 2:
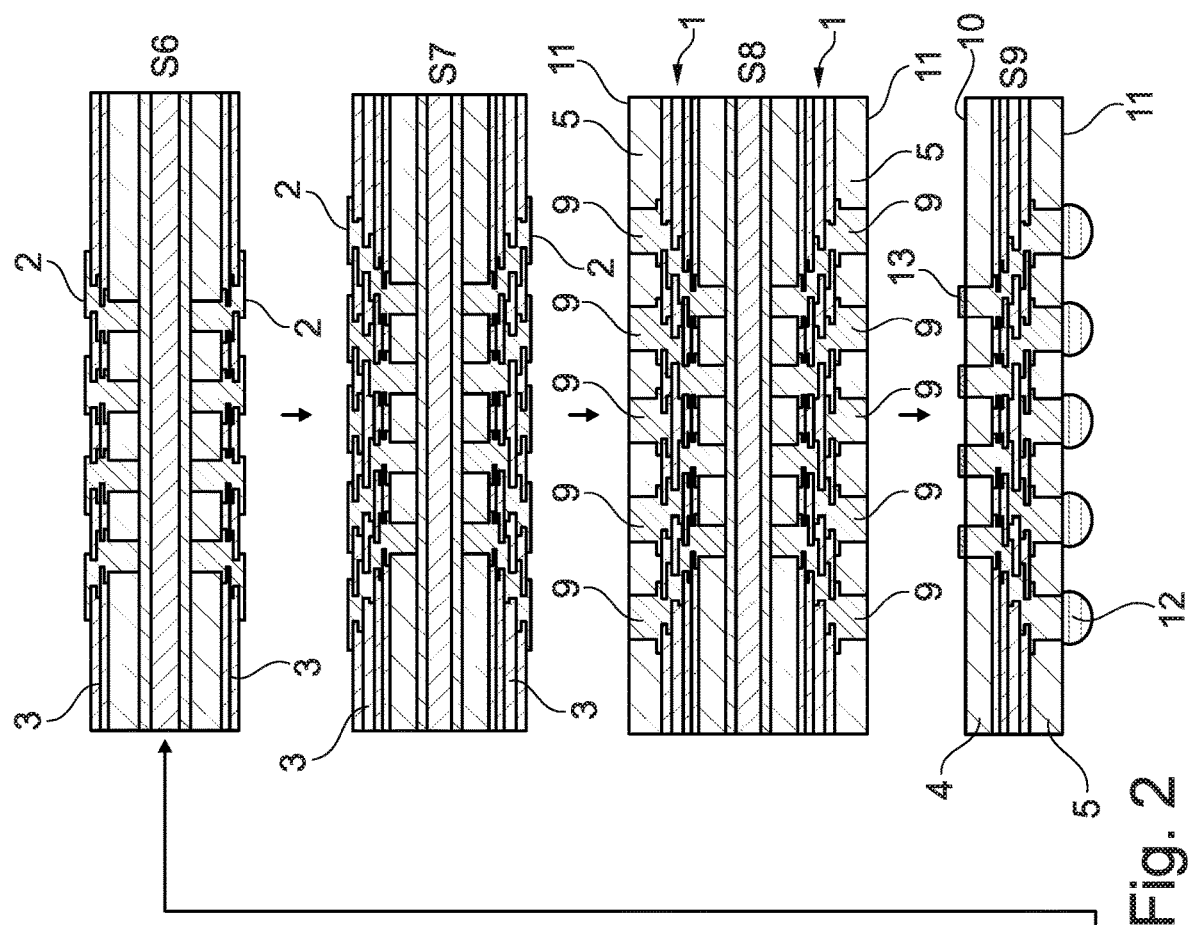
FIG. 2 illustrates a cross-sectional view of a method of manufacturing a component carrier according to another exemplary embodiment of the invention.
Figure 2:
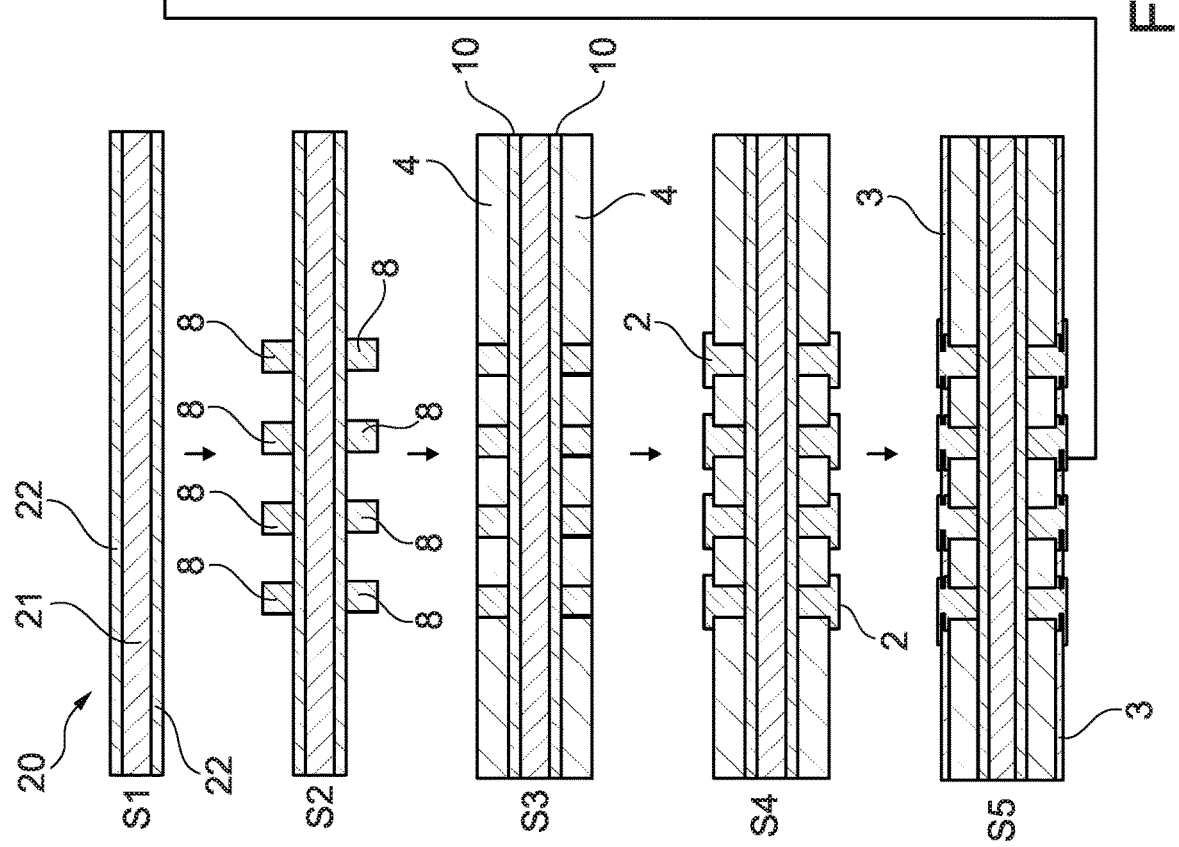

FIG. 2 illustrates a cross-sectional view of a method of manufacturing a component carrier according to another exemplary embodiment of the invention.

In a step S1, a temporary core member 20 is provided. The temporary core member 20 comprises a base 21 which is sandwiched by seed layers 22. The base 21 can be made of an insulating material, an electrically conductive material or a combination thereof. The seed layers 22 can be made of copper, for example a copper foil having a thickness between 2 and 5 µm. Both seed layers 22 form outer surfaces of the temporary core member 20.

However, the seed layers 22 can alternatively remain as a part of the component carrier 1 so that only the base 21 is a temporary component which is to be removed in a later manufacturing step.

On both seed layers 22 of the temporary core member 20, a respective component carrier 1 is formed in the subsequent steps, i.e. at the top side and at the bottom side of the temporary core member 20 in FIG. 2.

In a step S2, vias 8 are formed on both seed layers 22. The vias 8 have the shape of pillars. The vias 8 can be formed by use of a patterning process such as a lithographic process or an imaging and etching process, where a photo resist is applied, exposed by electromagnetic radiation and then developed, thereby forming holes, i.e. a negative image of the vias 8. Thereafter, an electroplating process is performed to fill the holes of the negative image by a metal, such as copper. Thereafter, the remaining resist is stripped so that the vias 8 are finished.

In step S2, also other additive processes like (3D)-printing are possible to form the vias 8.

In a step S3, the first stiffening structures 4, 4 are provided at the respective one side 10 of each stack. This can be done for example by molding a resin material, by laminating a laminate material or by applying a prepreg material on the temporary core member 20. In case of the laminate and prepreg materials, the pillar-shaped vias 8 are pierced through the laminate or prepreg material. It is further conceivable to use a PID (photo-imageable dielectric) material for the first stiffening structure 4. A patterning process can be readily performed with common PID structuring techniques.

Alternatively, it is conceivable to provide the first stiffening structure 4 before the step of forming the vias 8. In this case, the first stiffening structure 4 can be patterned, for example by a mechanical drilling process or by a photo or laser process to provide holes, which are then electroplated to form the vias 8.

In steps S4 to S7, several electrically conductive layer structures 2 and electrically insulating layer structures 3 are built-up onto the respective stacks.

In a step S8, vias 9 are formed on the electrically conductive layer structures 2 of each stack. The vias 9 have the shape of pillars. The vias 9 can be formed by use of a patterning process such as a lithographic process or an imaging and etching process, where a photo resist is applied, exposed by electromagnetic radiation and then developed, thereby forming holes, i.e. a negative image of the vias 9.

Thereafter, an electroplating process is performed to fill the holes of the negative image by a metal, such as copper. Thereafter, the remaining resist is stripped so that the vias 9 are finished.

By configuring the vias 8 having a smaller pitch and the vias 9 having the larger pitch, the stacks are configured as redistribution structure for transferring between a smaller pitch on the one side 10 of the respective stack towards a larger pitch on the opposing other side 11 of the respective stack.

Moreover, the second stiffening structures 5, 5 are provided at the opposing other side 11 of each stack. This can be done for example by molding a resin material, by laminating a laminate material or by applying a prepreg material on the temporary core member 20. In case of the laminate and prepreg materials, the pillar-shaped vias 9 are pierced through the laminate or prepreg material. It is further conceivable to use a PID (photo-imageable dielectric) material for the second stiffening structure 5. A patterning process can be readily performed with the PID material by imaging and etching.

Alternatively, it is conceivable to provide the second stiffening structure 5 before the step of forming the vias 9. In this case, the second stiffening structure 5 can be patterned, for example by a mechanical drilling process or by a photo or laser process to provide holes, which are then electroplated to form the vias 9.

After having formed the vias 9, the stacks manufactured so far are either removed from the base 21 or the entire temporary core member 20. If the copper foils 22 remain on the stacks manufactured so far, they can be detached, completely etched away from the thus manufactured stacks or structured to receive a base structure for the bonding pads 13.

A surface finish can be applied to the vias 8, 9 where soldering or bonding pads 13 and solder balls 12 are to be formed, which is later described in more detail on the basis of FIG. 6.

In a step S9, bonding pads for affixing solder balls 12 for a flip-chip connection are applied to the vias 9 (or the surface finish) at the opposing other side 11 of the stack, and planar soldering or bonding pads 13 are applied to the vias 8 (or the surface finish) at the one side 10 of the stack. In other words, the solder balls 12 for a flip-chip connection are applied to the vias 9 having the larger pitch, and the soldering or bonding pads 13 are applied to the vias 8 having the smaller pitch.

However, other configurations are possible where solder balls for a flip-chip connection are applied to the vias 8 having the smaller pitch, and soldering or bonding pads are applied to the vias 9 having the larger pitch. It is likewise possible to provide either solder balls for a flip-chip connection or soldering/bonding pads on all vias 8 and 9, or a mixed configuration of solder balls and soldering/bonding pads on one main surface of the component carrier 1. Different connections are conceivable such as direct bonding of a chip, via-bonding, application of pillars, connections to another substrate or PCB, etc.

By the above-mentioned method, a coreless component carrier 1 having a high stiffness is manufactured.

Figure 3:
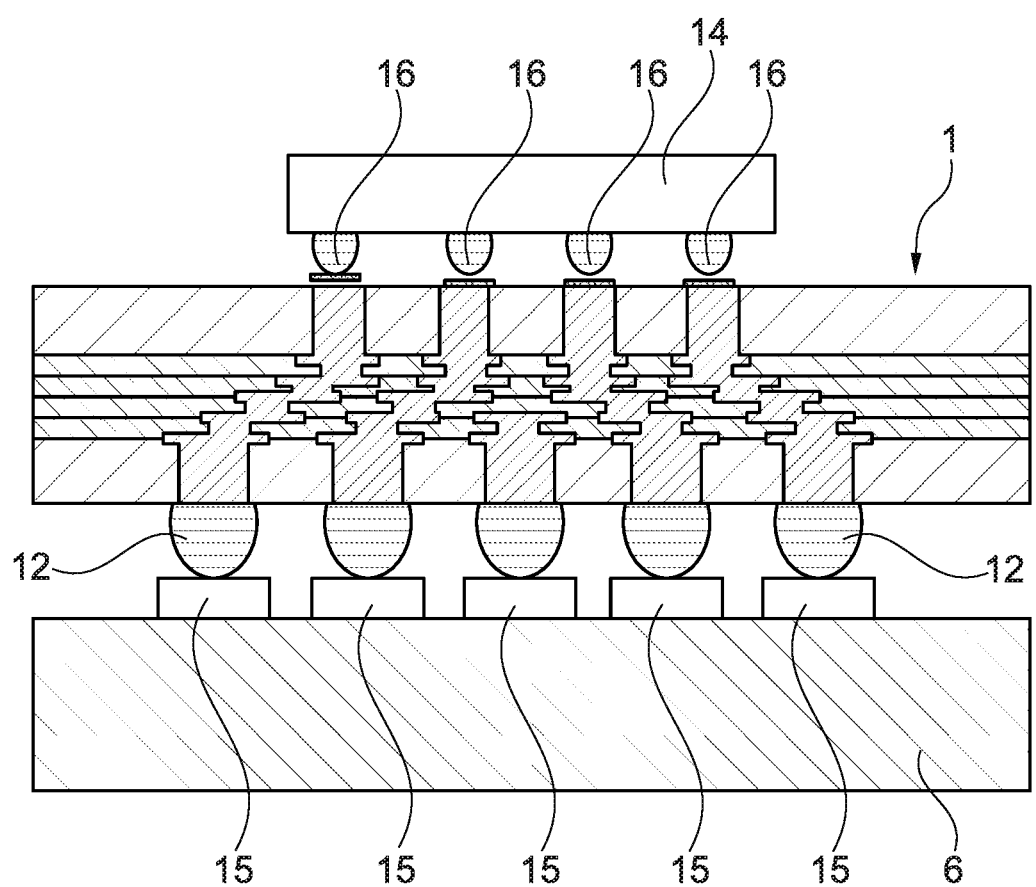
FIG. 3 illustrates a cross-sectional view of an electric device according to an exemplary embodiment of the invention.

FIG. 3 illustrates a cross-sectional view of an electric device according to an exemplary embodiment of the invention.

The electric device comprises a component carrier 1 according to the present invention, a mounting base 6 on which the component carrier 1 is mounted electrically connected with a respective one of the electrically conductive layer structures 2 having the larger pitch, and a component 14 being surface mounted on the component carrier 1 electrically connected with another respective one of the electrically conductive layer structures 2 having the smaller pitch.

In more detail, the mounting base 6 comprises contacts 15 corresponding to the solder balls or bumps 12 of the component carrier 1. The component carrier 1 is mounted to the mounting base 6 via the flip-chip method.

The component 14 of the embodiment can be a semiconductor device or any other active or passive device such as a capacitor or an inductor. The component 14 comprises contacts 16 corresponding to the soldering or bonding pads 13 of the component carrier 1. The component 14 is soldered or bonded onto the component carrier 1.

In this electric device, the component carrier 1 translates the larger pitch of the mounting base 6 to the smaller pitch of the component 14. The component carrier 1 may thus have, amongst others, a function of an adapter to connect the mounting base 6 to the component 14.

Although not shown in FIG. 3, the component 14 can be encapsulated by an encapsulant.

Figure 4:
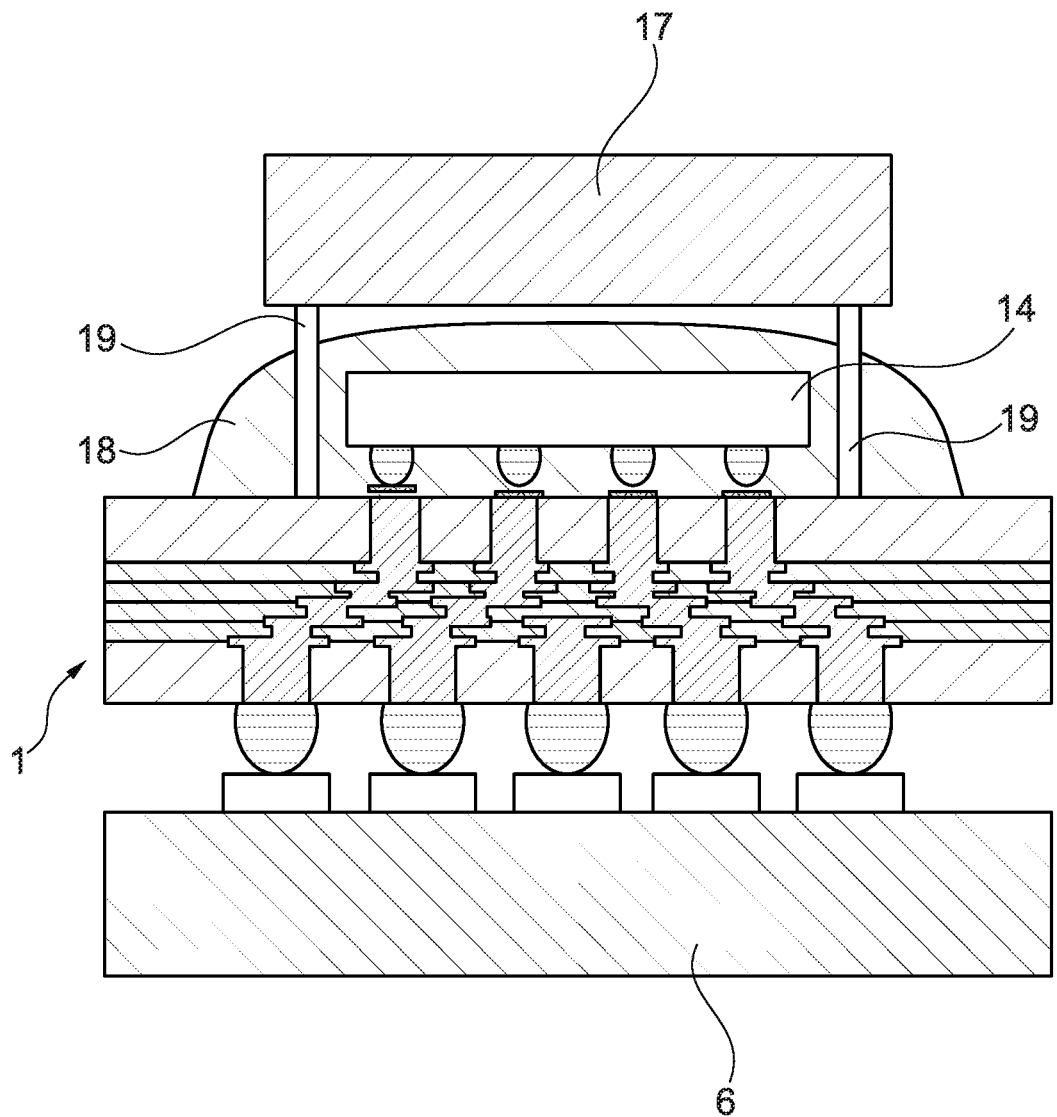
FIG. 4 illustrates a cross-sectional view of an electric device according to another exemplary embodiment of the invention.

FIG. 4 illustrates a cross-sectional view of an electric device according to another exemplary embodiment of the invention. The embodiment of FIG. 4 is similar to the embodiment of FIG. 3, wherein the differences there between are described as follows.

The component 14 is encapsulated by an encapsulant 18.

An additional component 17 is arranged above the component 14. The additional component 17 can also be a semiconductor chip so that a so-called chip-on-chip arrangement is achieved. The additional component 17 is connected by pins 19 to the electrically conductive layer structure 2 of the component carrier 1. The pins 19 penetrate the encapsulant 18. Although not shown in FIG. 4, the plurality of pins 19 may form a pin array.

In this arrangement, the component carrier 1 likewise serves as an adapter, presently between the mounting base 6 and a plurality of components 14, 17.

Figure 5:
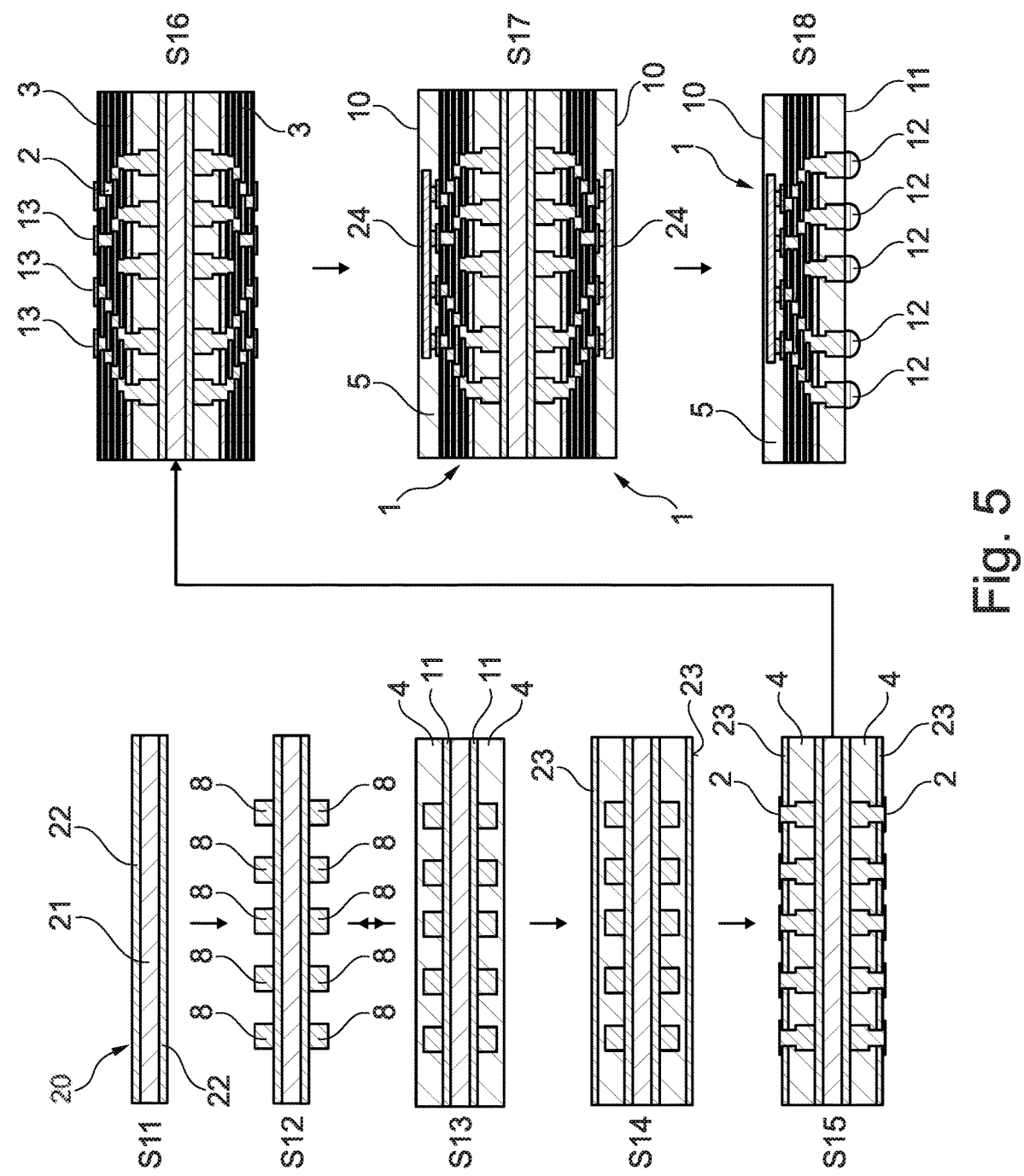
FIG. 5 illustrates a cross-sectional view of a method of manufacturing a component carrier according to another exemplary embodiment of the invention.

FIG. 5 illustrates a cross-sectional view of a method of manufacturing a component carrier according to another exemplary embodiment of the invention.

In a step S12, a temporary core member 20 is provided. The temporary core member 20 comprises a base 21 which is sandwiched by seed layers 22. The seed layers 22 can be made of copper, for example a copper foil having a thickness between 2 and 5 µm. Both seed layers 22 form outer surfaces of the temporary core member 20.

On both seed layers 22 of the temporary core member 20, a respective component carrier 1 is formed in the subsequent steps, i.e. at the top side and at the bottom side of the temporary core member 20 in FIG. 5.

In a step S12, vias 8 are formed on both seed layers 22. The vias 8 have the shape of pillars. The vias 8 can be formed by use of a patterning process such as a lithographic process or an imaging and etching process, where a photo resist is applied, exposed by electromagnetic radiation and then developed, thereby forming holes, i.e. a negative image of the vias 8. Thereafter, an electroplating process is performed to fill the holes of the negative image by a metal, such as copper. Thereafter, the remaining resist is stripped so that the vias 8 are finished.

In step S12, also other additive processes like (3D)-printing are possible to form the vias 8.

In a step S13, the first stiffening structures 4, 4 are provided at the respective opposing other side 11 of each stack. This can be done for example by overmolding a resin material, by laminating a laminate material or by applying a prepreg material on the temporary core member 20. The vias 8 are covered by the first stiffening structure 4. In case of the laminate and prepreg materials, the pillar-shaped vias 8 are pierced through the laminate or prepreg material. It is further conceivable to use a PID (photo-imageable dielectric) material for the first stiffening structure 4. A patterning process can be readily performed with common PID structuring techniques.

In a step S14, the first stiffening structures 4, 4 of each stack are laminated by a dielectric material 23.

In a step S15, the dielectric material 23 and the first stiffening structures 4, 4 are patterned, and an electroplating process is performed by a metal, such as copper, in order to build-up the electrically conductive layer structures 2 which are electrically connected to the vias 8. The patterning process can be a lithographic process, an imaging and/or etching process, where a photo resist is applied, exposed by electromagnetic radiation and then developed, thereby forming holes. Thereafter, an electroplating process is performed to fill the holes of the negative image by a metal, such as copper. Thereafter, the remaining resist is stripped so that the electrically conductive layer structures 2 are finished.

In a step S16, several electrically conductive layer structures 2 and electrically insulating layer structures 3 are built-up onto the respective stacks. Planar soldering or bonding pads 13 are applied to outermost electrically conductive layer structure 2. Before that, a surface finish can be applied onto the locations, where soldering or bonding pads 13 are to be applied.

The outermost electrically conductive layer structure 2 forms electrical contacts towards the one side 10 of the stack, which have a smaller pitch than the vias 8 which are formed on the other side 11 of the stack so that the resulting stacks are configured as redistribution structure for transferring between a smaller pitch on the one side 10 of the respective stack towards a larger pitch on the opposing other side 11 of the respective stack.

The pitch of each superposed electrically conductive layer structure 2 is successively reduced compared with an underlying electrically conductive layer structure 2.

In a step S17, dies 24 are attached on the respective outer layers of the so far manufactured stacks, wherein each die 24 is electrically contacted with the outermost electrically conductive layer structure 2 of the respective stack. Then, the dies 24 at each one side 10 of the respective stack are overmolded by a mold material which forms the second stiffening structure 5 at each one side 10 of the respective stack.

In a step S18, the component carriers 1 manufactured so far are removed from the temporary core member 20. The copper foils 22 are detached, completely etched away or structured to receive a base structure for the soldering pads 13.

A surface finish can be applied to the vias 8 where solder balls 12 are to be formed. The process can be similar as shown in FIG. 6.

The solder balls 12 for a flip-chip connection are applied to the vias 8 or the surface finish at the opposing other side 11 of each stack.

By the above-mentioned method, a coreless component carrier 1 having a high stiffness is manufactured, wherein the die 24 is embedded therein.

Figure 6:
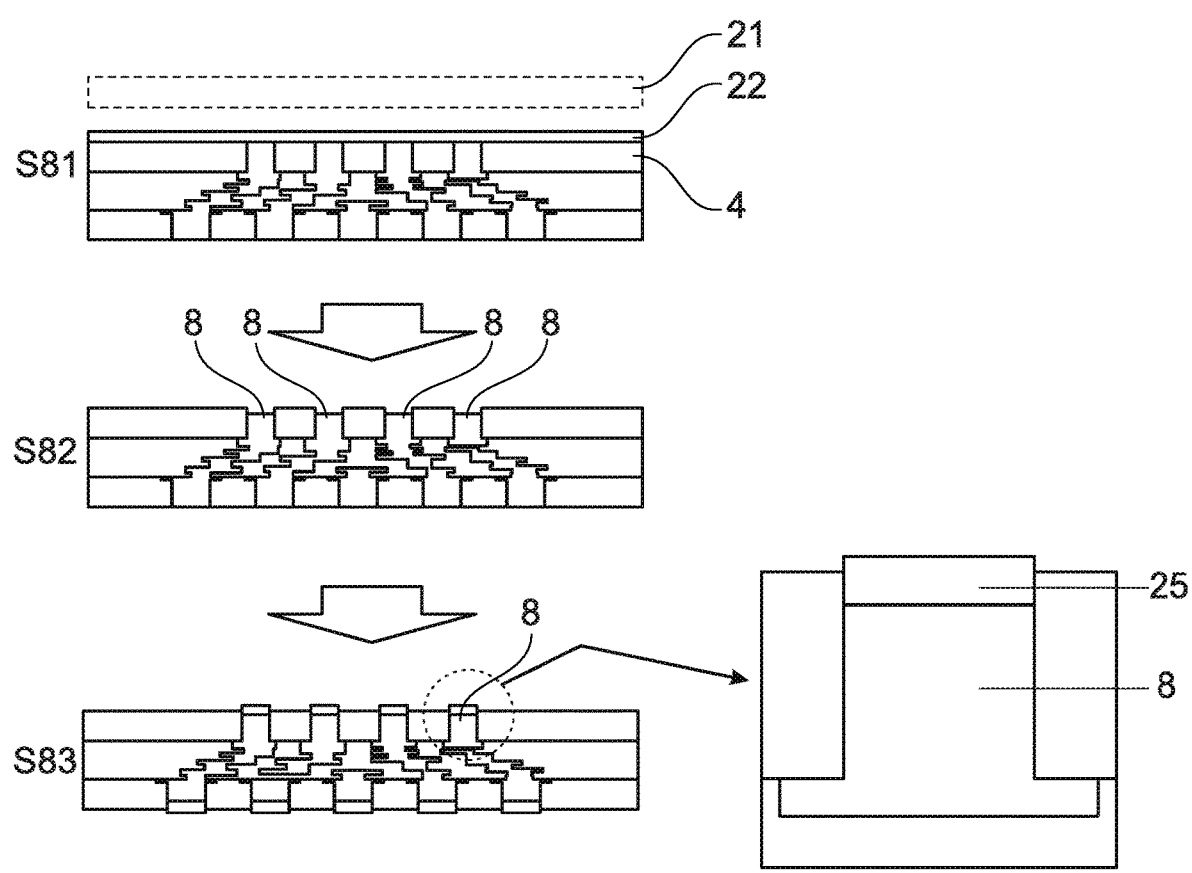
FIG. 6 illustrates a surface finishing process in the method of manufacturing a component carrier of FIG. 2 according to an exemplary embodiment of the invention.

FIG. 6 illustrates a surface finishing process in the method of manufacturing a component carrier 1 of FIG. 2 according to an exemplary embodiment of the invention. The surface finishing process is performed after step S8 and before step S9.

In a step S81, the base 21 is removed from the stacks manufactured so far, wherein the seed layers 22 remain on the respective stacks.

In step S82, the seed layers 22, which are for example copper foils, are completely etched away. Alternatively, the seed layers 22 can only partially be removed. For example, they can be structured or patterned to receive a base structure for bonding pads.

In a step S83, a surface finish 25 is applied to the vias 8 and/or the vias 9. The material of the surface finish can be ENEPIG (Electroless Nickel Electroless Palladium Immersion Gold).

The present invention is applicable to all electronic devices which need thin component carriers, for example mobile phones and laptops.

It should be noted that the term "comprising" does not exclude other elements or steps and the article "a" or "an" does not exclude a plurality. Also, elements described in association with different embodiments may be combined.

Implementation of the invention is not limited to the preferred embodiments shown in the figures and described above. Instead, a multiplicity of variants is possible which use the solutions shown and the principle according to the invention even in the case of fundamentally different embodiments.

The invention claimed is:

1. A method of manufacturing a component carrier, comprising:
   forming a stack having electrically conductive layer structures and electrically insulating layer structures;
   configuring the stack as a redistribution structure for transferring between a smaller pitch on one side of the stack towards a larger pitch on an opposing other side of the stack;
   arranging a first stiffening structure and a second stiffening structure in opposing surface regions of the stack, wherein the first stiffening structure and the second stiffening structure have a higher stiffness than electrically insulating layer structures of the stack between the first stiffening structure and the second stiffening structure; and
   forming vias penetrating the first stiffening structure and communicating with the electrically conductive layer structures, wherein the vias are arranged at the one side of the stack and have the smaller pitch.

2. The method according to claim 1, wherein at least one of the electrically conductive layer structures extends at least through one of the first and second stiffening structures.

3. The method according to claim 1, further comprising:
   embedding a component in at least one of the stiffening structures.

4. The method according to claim 1, wherein an electrically conductive layer structure extends through the stiffening structure in which the component is embedded.

5. The method according to claim 3, wherein a further component is surface mounted on the stiffening structure in which the component is embedded.

6. The method according to claim 4, wherein a further component is surface mounted on the stiffening structure in which the component is embedded.

7. The method according to claim 1, wherein
   a stiffness of at least one of the stiffening structures is in a range between 50 and 1500 N·mm$^2$.

8. The method according to claim 1, wherein at least one of the stiffening structures is a mold compound.

9. The method according to claim 1, wherein the stiffening structures form part of two electrically insulating layer structures.

10. The method according to claim 1, further comprising at least one of the following features:

the component carrier has at least one component surface mounted on and/or embedded in the component carrier, wherein the at least one component is selected from a group consisting of an electronic component, an electrically non-conductive and/or electrically conductive inlay, a heat transfer unit, a light guiding element, an energy harvesting unit, an active electronic component, a passive electronic component, an electronic chip, a storage device, a filter, an integrated circuit, a signal processing component, a power management component, an optoelectronic interface element, a voltage converter, a cryptographic component, a transmitter and/or receiver, an electromechanical transducer, an actuator, a microelectromechanical system, a microprocessor, a capacitor, a resistor, an inductance, an accumulator, a switch, a camera, an antenna, a magnetic element, a further component carrier, and a logic chip;

wherein at least one of the electrically conductive layer structures of the component carrier comprises at least one of a group consisting of copper, aluminum, nickel, silver, gold, palladium, and tungsten;

wherein the electrically insulating layer structure comprises at least one of a group consisting of reinforced or non-reinforced resin, epoxy resin or Bismaleimide-Triazine resin, FR-4, FR-5, cyanate ester, polyphenylene derivate, glass, prepreg material, polyimide, polyamide, liquid crystal polymer, epoxy-based Build-Up Film, polytetrafluoroethylene, a ceramic, and a metal oxide;

wherein the component carrier is shaped as a plate;

wherein the component carrier is configured as one of a group consisting of a printed circuit board, a substrate, and an interposer;

wherein the component carrier is configured as a laminate-type component carrier.

* * * * *